United States Patent [19]

Sakai et al.

[11] Patent Number: 4,525,747
[45] Date of Patent: Jun. 25, 1985

[54] ANALOG-TO-DIGITAL IMAGE SIGNAL CONVERSION

[76] Inventors: Toshiyuki Sakai, 158, Nasahara-Motomachi, Takatsuki-shi, Ohsaka-fu; Yuichi Ohta, 2-9, Tennoh-cho, Takatsuki-shi, Ohsaka-fu; Michihiko Minoh, 18, Higashi-Kujo-Aketa-cho, Minami-ku, Kyoto-shi, Kyoto-fu; Masatoshi Hino, 2-13-2, Kubo, Onomichi-shi, Hiroshima-ken, all of Japan

[21] Appl. No.: 405,766

[22] Filed: Aug. 6, 1982

[30] Foreign Application Priority Data

Aug. 6, 1981 [JP] Japan ............................. 56-123303
Aug. 6, 1981 [JP] Japan ............................. 56-123304

[51] Int. Cl.³ ............................................. H04N 1/40
[52] U.S. Cl. ................................. 358/284; 358/282; 382/52; 382/53
[58] Field of Search ..................... 358/284, 282, 280; 382/52, 53

[56] References Cited

U.S. PATENT DOCUMENTS

| | | | |
|---|---|---|---|
| 3,912,943 | 10/1975 | Wilson | 358/282 |
| 3,952,144 | 4/1976 | Kolker | 358/282 |
| 3,987,413 | 10/1976 | Wilmer | 358/282 |
| 4,227,218 | 10/1980 | Vandling | 358/282 |
| 4,234,895 | 11/1980 | Sommer | 358/282 |
| 4,297,676 | 10/1981 | Moriya | 382/53 |

*Primary Examiner*—Howard W. Britton
*Attorney, Agent, or Firm*—Guy W. Shoup

[57] ABSTRACT

A system for converting an analog image signal into a digital image signal is provided. The system comprises an analog-to-digital signal converter for producing a digital signal by subjecting an incoming analog signal to threshold processing with a threshold level. The system also comprises a peak/valley extracting circuit for extracting peak and valley points corresponding to thin lines and narrow gaps between lines, respectively, in the original image scanned. The extracted peak and valley points are utilized in the analog-to-digital conversion processing so as not to lose information as to thin lines and narrow gaps between lines. Especially, in extracting peak and valley points, the concentration or level of a particular picture element is compared with that of the adjacent picture elements at least in two directions.

11 Claims, 10 Drawing Figures

ANALOG-TO-DIGITAL IMAGE SIGNAL CONVERSION

BACKGROUND OF THE INVENTION

1. Field of the Invention

This invention relates to an image signal processing system and, in particular, to a system for converting an analog image signal obtained by scanning a two-dimensional image into a binary image signal with the use of an adjustable threshold level.

2. Description of the Prior Art

Figure 1:
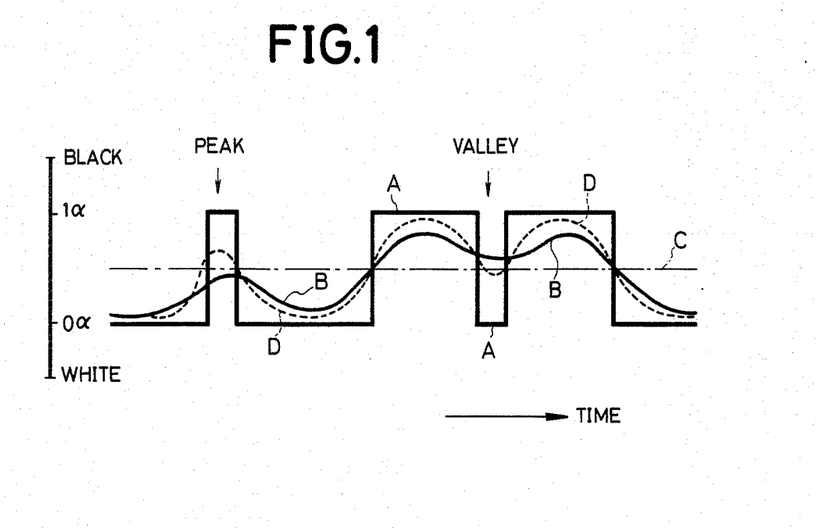
FIG. 1 is a time chart useful for understanding that some information, particularly a narrow line indicated by "PEAK" and a narrow gap between lines indicated by "VALLEY", might be lost as a result of the analog-to-digital conversion depending upon the setting value of the threshold level.

In an imaging system of a facsimile and the like, if an image signal having waveform A shown in the time chart of FIG. 1 is used to produce an image and then it is processed through photo-electric conversion, the resultant image signal will have waveform B also shown in FIG. 1. As shown, the recovered image signal B is significantly corrupted as compared with the original image signal A. Such corruption in waveshape can be critical in the process of analog-to-digital image signal conversion. For example, if the corrupted image signal B is subjected to binary value conversion processing with the use of threshold level C, the narrow line section indicated by "PEAK" will fade away, i.e. the area to be recorded in black will be recovered in white, and, moveover, the narrow gap section between lines indicated by "VALLEY" will disappear, i.e., the area to be recorded in white will be recorded in black. This is disadvantageous because the recorded image will be blurred and some delicate information will be lost.

The prior art approach to cope with such a problem is to carry out the step of emphasizing high frequency components of an analog image signal prior to the step of threshold processing. In accordance with such a prior art technique, the corrupted signal B can be compensated as shown by waveform D, so that the information as to narrow lines and narrow gaps between lines may be preserved even if threshold processing is carried out. However, the prior art technique is ineffective in the case where narrow lines and/or narrow gaps between lines run in parallel with the scanning direction, and, moreover, it has a disadvantage of susceptibility to noise.

SUMMARY OF THE INVENTION

The disadvantages of the prior art are overcome with the present invention and an improved system for converting an analog image signal into a digital image signal is provided.

In accordance with the present invention, an analog image signal to be converted into a digital image signal is first examined to extract peak points, which correspond to narrow lines of an image, and valley points, which correspond to narrow gaps between lines. The peak and valley points tend to be lost in the process of analog-to-digital conversion, causing a blur in a reproduced image. However, in accordance with the present invention, the threshold level to be used in the conversion process is adjustably determined in accordance with the information of the extracted peak and valley points such that they will not be lost in the converted digital image signal.

The present invention is characterized by providing a system for converting an analog image signal into a digital image signal, said analog image signal being obtained by scanning a two-dimensional image along a horizontal line progressively from top to bottom, said horizontal line including a predetermined number of picture elements in each of which the corresponding part of said analog image signal is converted into a digital value, said analog system comprising: analog-to-digital converting means for converting said analog image signal into a digital image signal by comparing in each picture element said analog image signal with a threshold level; extracting means for extracting peak and valley picture elements from said analog image signal, said picture element being determined as a peak picture element if its concentration is higher than those among all of its adjacent picture elements that are located in predetermined first and second directions with respect to said picture element in question, and said picture element being determined as a valley picture element if its concentration is lower than those among all of its adjacent picture elements that are located in said predetermined first and second directions with respect to said picture element in question; and control means for controlling said threshold level in accordance with the information as to peak and valley picture elements from said extracting means so that the information as to peak and valley picture elements may be well reflected in said digital image signal.

It is therefore a general object of the present invention to provide an improved system for converting an analog image signal into a digital image signal.

Another object of the present invention is to provide an analog-to-digital image signal converting system capable of adjustably setting the threshold level to be used in the conversion process in accordance with the condition of an analog image signal to be processed.

A further object of the present invention is to provide an analog-to-digital image signal converting system capable of maintaining information as to narrow lines and narrow gaps between lines existing in an original two-dimensional image in the converted digital image signal.

Other objects, advantages and novel features of the present invention will become apparent from the following detailed description of the invention when considered in conjunction with the accompanying drawings.

BRIEF DESCRIPTION OF THE DRAWINGS

FIGS. 2(a) and (b) are illustrations showing the principle of extracting peak and valley picture elements in accordance with the present invention;

DESCRIPTION OF THE PREFERRED EMBODIMENTS

Figure 2:
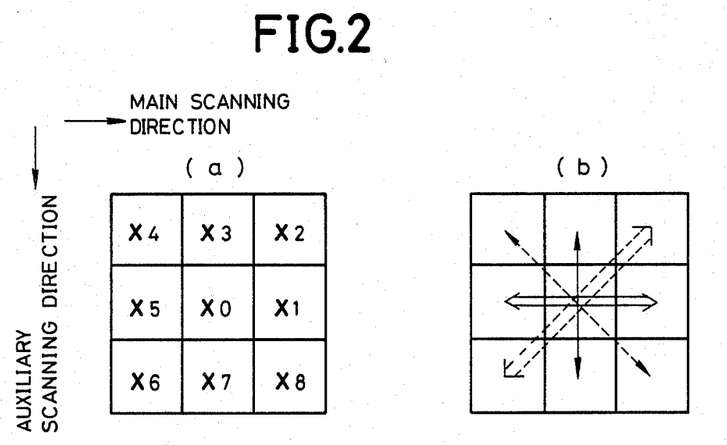

In accordance with the present invention, a peak point forming a part of a narrow line and a valley poinr forming a part of a narrow gap between lines in a two-dimensional image are extracted, and the thus extracted peak and valley points are used to set the threshold level in carrying out analog-to-digital image signal conversion. The extraction of such peak and valley points will be described with reference to FIGS. 2(a) and (b). In principle, an image represented by an analog image signal to be converted into a digital image signal is examined through a window of $3 \times 3$ picture elements as shown in FIG. 2(a). As shown, $x_0$ is a picture element of interest, and its concentration, i.e., level of analog image signal, is compared with those of the surrounding or adjacent picture elements $x_1$ through $X_8$. Such a comparison is carried out in four steps, each different in direction as shown in FIG. 2(b). Thus, in each step of the comparison, the concentration of the central picture element $x_0$ is compared with the concentration of each of the oppositely located picture elements, e.g., $x_1$ and $x_5$, $x_3$ and $x_7$, $x_2$ and $x_6$, and $x_4$ and $x_8$. Each direction is turned over 45 degrees from the adjacent direction on the same plane. Upon comparison, if the central picture element $x_0$ is higher in concentration than those picture elements located in selected two or more directions, it is extracted as a peak point or picture element. On the other hand, if the central picture element $x_0$ is lower in concentration than those picture elements located in selected two or more directions, it is extracted as a valley point or picture element. For example, in the case where picture element $x_0$ is higher in concentration than any of the two picture elements $x_3$ and $x_7$ located along a first direction and also any of the two picture elements $x_1$ and $x_5$ located along a second direction, picture element $x_0$ is extracted as a peak picture element or point. The similar arguments hold true for a valley picture element.

The above described thchnique may not be applied to extract peak and valley points for a fat line or a wide gap between lines where no high space frequency components are involved. It should however be noted that blurring is generally caused by thin lines or narrow gaps between lines which involve high space frequency components. And therefore it may well be said that it is only necessary to extract peak and valley points for those areas involving high space frequency components for the purpose of the present invention. The peak and valley points thus extracted are elements of structural information to be preserved as a part of an "image" or "background" after threshold processing. That is, peak and valley points must be reflected in a binary image signal to have levels $1_\alpha$ and $0_\alpha$, respectively, as shown in FIG. 1. Otherwise, those peak and valley points will disappear and blurring will be produced in a reproduced image.

Under the circumstances, in accordance with the present invention, the threshold level to be used in threshold processing is determined such that the extracted peak and valley points may be reflected in a converted binary image signal as faithfully as possible. More specifically, in accordance with one embodiment of the present invention, those peak and valley points that are not correctly reflected in a converted binary image signal are counted as errors, and then, the threshold level is determined optimally in accordance with the counted number of errors. By so doing, a binary image signal may be obtained without losing much of information as to thin lines and narrow gaps between lines.

Figure 3:
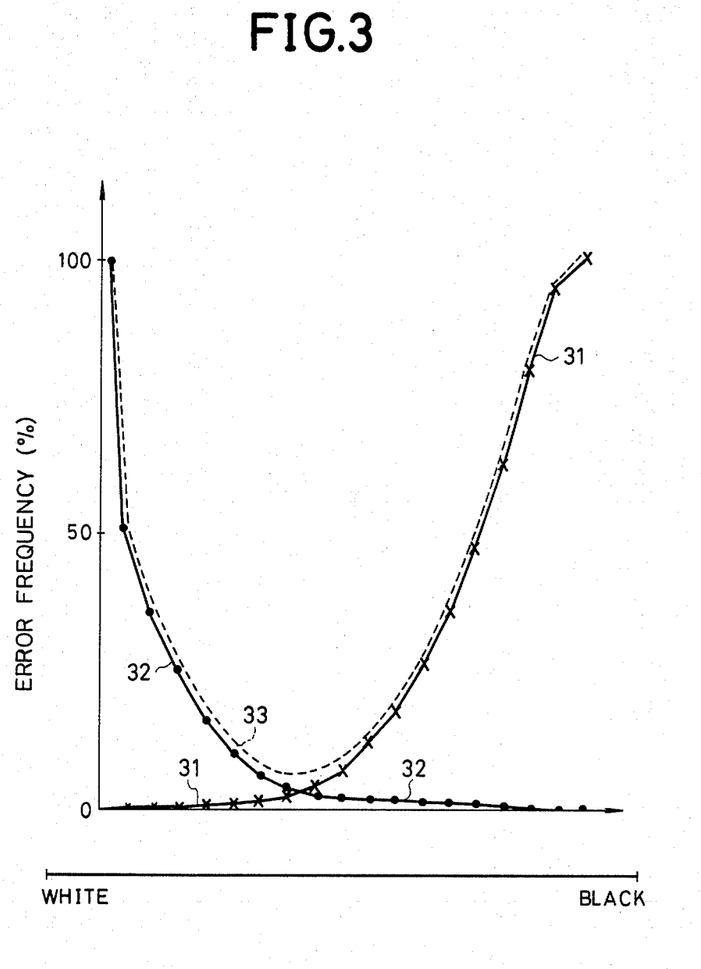
FIG. 3 is a graph showing the relation between the threshold level and the peak or valley point error frequency.

FIG. 3 is a graph showing the relation between the frequency of occurrence of errors in peak and valley points and the threshold level, in which the abscissa is taken for the threshold level between "white" and "black", and the ordinate is taken for error frequency in %. The dots and crosses shown are experimentally obtained results. Curve 31 indicates a percentage of the number of peak errors for the total number of peak points; whereas, curve 32 indicates a percentage of the number of valley errors with respect to the total number of valley points. Moreover, curve 33 indicates a total error frequency for a simple sum of peak and valley errors. Accordingly, in principle, an accurate binary image signal may be obtained if the threshold level in analog-to-digital conversion is set at the minimum point of curve 33. However, if it is desired that a reproduced image has less peak or valley points, the numbers of peak and valley errors may be weighted before summation, and then the threshold level may be determined to satisfy the condition that such a weighted sum is a minimum. It has been experimentally found that, in general, an image of better quality can be reproduced by determining the threshold level such that the weighted sum with a larger weighting factor for the number of valley errors, i.e., losing more peak points, is minimal.

Figure 4:
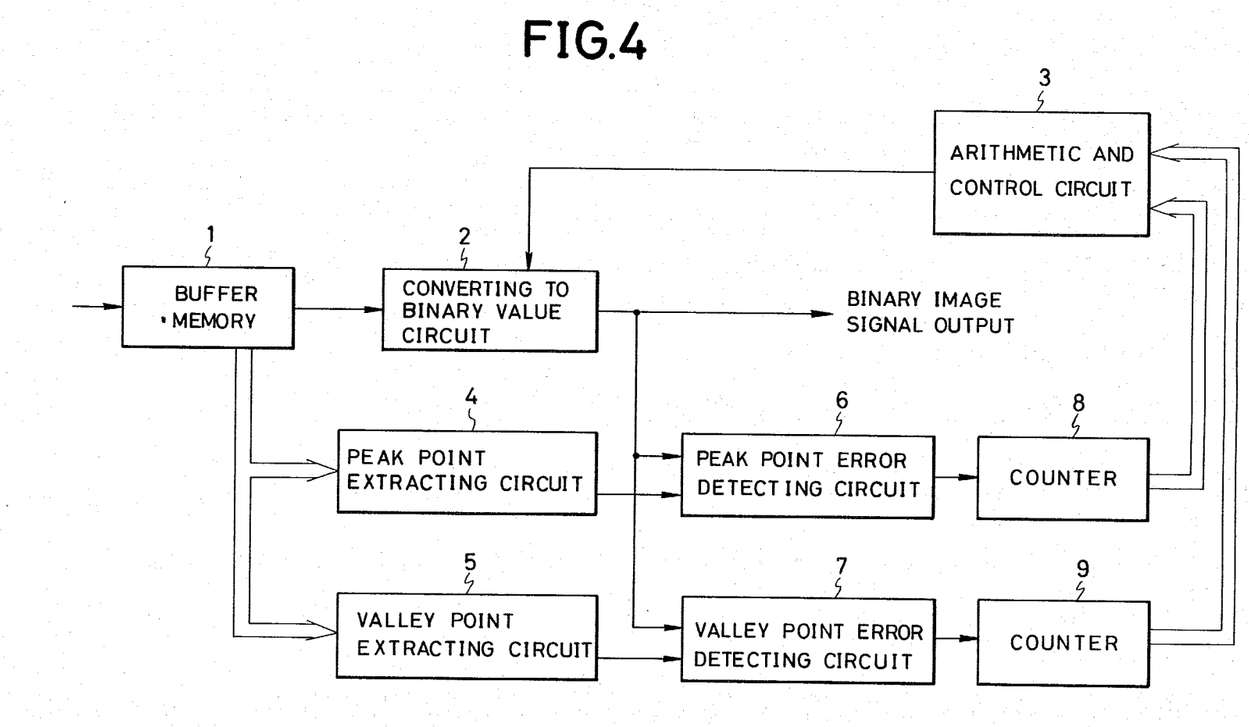
FIG. 4 is a block diagram showing one embodiment of the present invention.

Referring now to FIG. 4, there is shown an analog-to-digital image signal converting system embodying the present invention, which comprises a buffer memory 1 to which an analog image signal supplied from an image sensor or the like in an imaging system of a facsimile machine is applied and it is temporarily stored therein. The buffer memory 1 may be comprised of an analog memory element such as a Bucket Brigade Device (BBD). The memory 1 is connected to a converting-to-binary-value circuit 2, and thus the analog image signal is supplied from the memory 1 to the circuit 2 from picture element to picture element successively thereby the analog signal is subjected to threshold processing with the threshold level determined by an arithmetic and control circuit 3 to produce a binary image signal as an output.

On the other hand, the memory 1 is connected to a peak point extracting circuit 4 and also to a valley point extracting circuit 5. Thus, these circuits 4 and 5 receive an analog image signal from the memory 1 and examine it through the window of $3 \times 3$ picture elements shown in FIG. 2 to extract peak and valley points, respectively. A peak point error detecting circuit 6 is connected to receive one input from the circuit 2 and another input from the circuit 4. The detecting circuit 6 supplies a peak error signal as its output if the state of the binary image signal output from the conversion circuit 2 is "0" (or "white") at the time when a peak point extracting signal is output from the peak point extracting circuit 4. Similarly, a valley point error detecting circuit 7 is connected to receive one input from the circuit 2 and another input from the circuit 5. And the detecting circuit 7 supplies a valley error signal as its output if the state of the binary image signal output from the conversion circuit 2 is "1" (or "black") at the time when the valley point extracting circuit 5 supplies a valley point extracting signal as its output. Counters 8 and 9 are connected to receive peak and valley error signals, respectively, to count the number of errors occurred.

An arithmetic and control circuit 3 is connected to receive the counted numbers of errors from the counters 8 and 9 and it is also connected to supply its control signal to the conversion circuit 2. In operation, the arithmetic and control circuit 3 receives the counted numbers of errors from the counters 8 and 9 for each scanning line and at the same time have the counters 8 and 9 reset. The counted numbers thus received are operated to produce a simple sum (or weighted sum in the circuit 3. Then the thus obtained sum is compared with other sums which have been individually obtained for previous several scanning lines and are now stored thereby determining the threshold level of the conversion circuit 2 appropriately. Stated more in detail, depending upon how the sum of peak and valley errors changes over previous several scanning lines, the threshold level of the conversion circuit 2 is optimized by causing it to come closer to the minimum point or its predetermined neighborhood of curve 33 shown in FIG. 3.

Incidentally, the peak point extracting circuit may be easily structured such that it refrains from supplying a peak error signal as its output in the case where the concentration of the picture element in question is apparently in the "background" level even if the picture element in question is larger in concentration than those adjacent picture elements located in selected two or more directions. Such a structure is preferable because the "background" portion where no image exists becomes less susceptible to noise.

Figure 5:
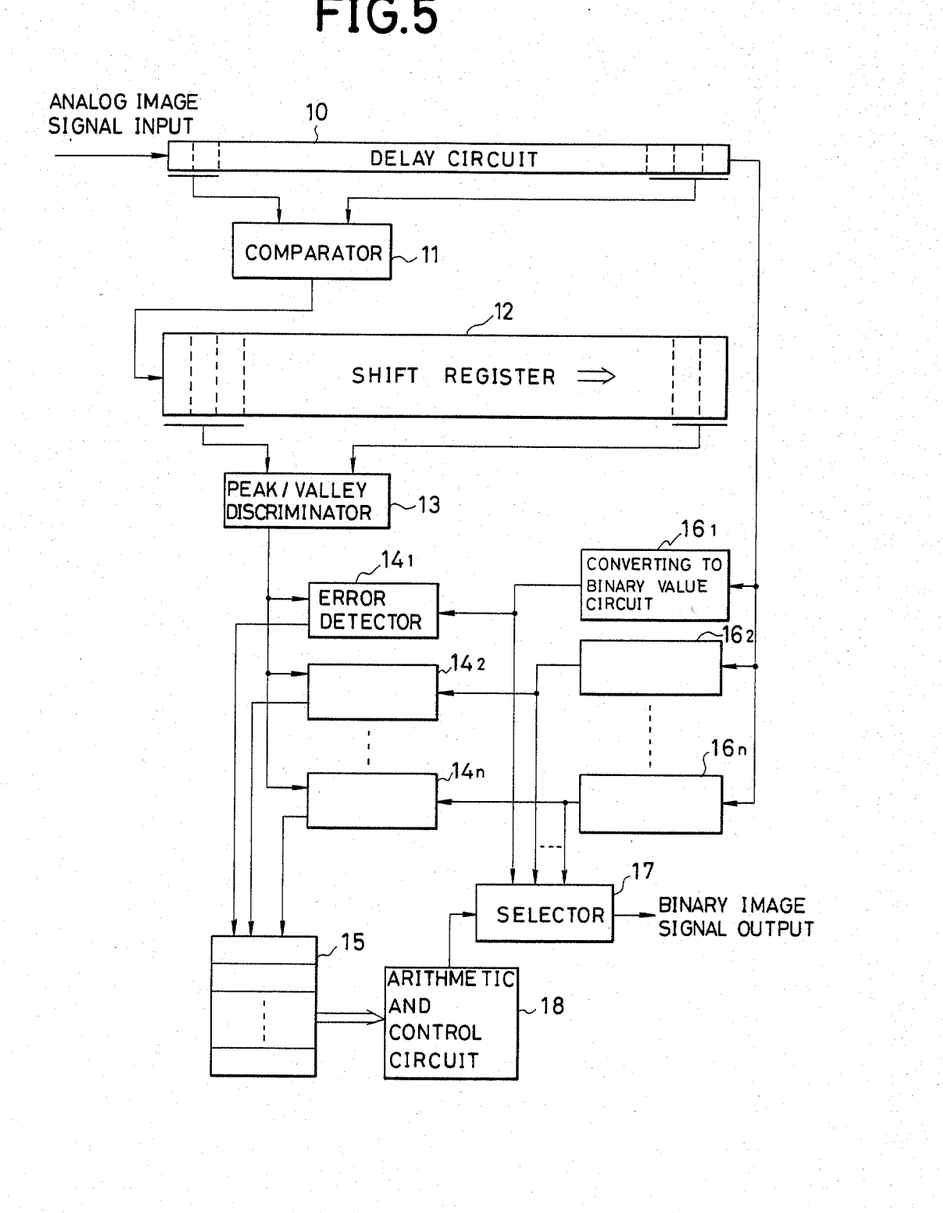
FIG. 5 is a block diagram showing another embodiment of the present invention.

FIG. 5 is a block diagram showing another embodiment of the present invention. As shown, this analog-to-digital image signal converting system comprises a delay circuit 10 which receives an analog image signal as its input as supplied from an image sensor (not shown). The delay circuit 10 has a capability of storing analog image information approximately for a single scanning line and it may be comprised of a BBD.

Figure 6:
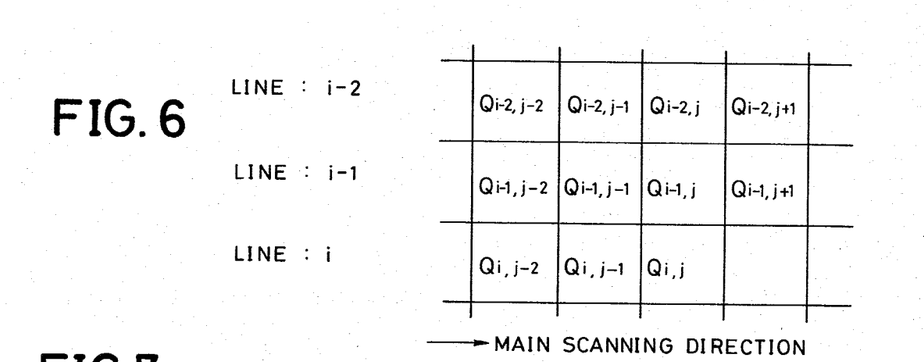
FIG. 6 is a schematic illustration useful for understanding the operation of the system shown in FIG. 5.

When the analog image signal which corresponds to picture element $Q_{i,j}$, in the scanning line i as shown in FIG. 6 is input to the delay circuit 10, the analog image signal of this picture element $Q_{i,j}$ together with the analog image signals of the adjacent four picture elements $Q_{i,j-1}$, $Q_{i-1,j-1}$, $Q_{i-1,j}$ and $Q_{i-1,j+1}$ are supplied from the delay circuit 10 to a comparator 11. The comparator 11 compares the level or concentration of the picture element $Q_{i,j}$ with that of each of the four picture elements and then supplies the results, each in the form of an eight-bit digital data, to a shift register 12 in parallel. The shift register 12 has the number of columns (8 bits/column) approximately equal to the number of picture elements in a single scanning line.

At the time when the data of the picture element $Q_{i,j}$ is supplied into the shift register 12, the analog image signal of the picture element $Q_{i-1,j-1}$ is supplied to n number of conversion circuits $16_1$ through $16_n$ at the same time from the delay circuit 10. The converting-to-binary-value or simply conversion circuits $16_1$ through $16_n$ are so structured that each has a different threshold level in carrying out conversion processing. Thus each of the conversion circuits $16_1$ through $16_n$ processes the incoming analog image signal with its individual threshold level and supplies its result as a binary image signal output. At this time, since all of the information as to the results of comparison in concentration or level between the analog image signal of the picture element $Q_{i-1,j-1}$, which is now in the analog-to-binary conversion process, and those of the eight adjacent picture elements which surround the picture element $Q_{i-1,j-1}$ are stored in the shift register 12, a peak/valley discriminator 13 determines as to whether the picture element $Q_{i-1,j-1}$ is a peak point or a valley point on the basis of the information as to the results of comparison and then supplies its result to each of error detectors $14_1$ through $14_n$ at the same time. Incidentally, in the process of discriminating a picture element to be a peak or a valley point, the contents of particular five columns in the shift register are referred; however, the number of bits of the actually referred data is 16. Moreover, the output from the peak/valley discriminator 13 is a 2-bit signal.

Each of the error detectors $14_1$ through $14_n$ is connected to receive a peak or valley signal from the peak/valley discriminator 13 and another input from the corresponding conversion circuit $16_i$ ($1 \leq i \leq n$). In operation, when the peak/valley discriminator 13 supplies a peak signal, the error detectors $14_i$ ($1 \leq i \leq n$) supply peak error signals as their outputs if the corresponding conversion circuits $16_i$ ($1 \leq i \leq n$) supply "0" level (or "white") signals to the detectors. On the other hand, if the corresponding conversion circuits 16 supply "1" level (or "black") signals while the peak/valley discriminator 13 supplies a valley signal, the detectors 14 supply valley error signals as their outputs. As shown, the counter 15 receives these error signals and it stores the numbers of peak and valley errors separately for each of the error detectors $14_1$ through $14_n$.

The analog-to-digital analog image signal converting system of FIG. 5 further comprises an arithmetic and control circuit 18 which is connected to receive counted numbers of errors from the counter 15 and supplies a select signal to a selector 17 which allows to pass selectively one of the binary image signals from the conversion circuits $16_1$ through $16_n$ in response to the select signal. In operation, the arithmetic and control circuit 18 receives the counted values of errors from the counter every single scanning line and executes an operation to select one of the conversion circuits $16_1$ through $16_n$ which is minimal in peak and valley errors on the basis of the counted values thus received as well as counted values for previous several scanning lines which have been so far stored therein to supply a select signal containing the information of the selected conversion circuit 16 to the selector 17. As a result, the selector circuit 17 allows to pass only the output from the selected conversion circuit 16 as a binary image signal out of the system. As may have been already understood, the arithmetic and control circuit 18 supplies a select signal to the selector 17 for each scanning line. The counter 15, on the other hand, is reset every scanning line by the arithmetic and control circuit 18.

It is to be noted that the threshold level of each of the conversion circuits $16_1$ through $16_n$ does not need to be fixed and it may be controllably adjusted, for example, in accordance with an average level of an analog image signal over a predetermined number of picture elements. Furthermore, similarly with the peak point extracting circuit 4 of the previous embodiment shown in FIG. 4, the peak/valley discriminator 13 may be structured such that it refrains from supplying a peak error signal in the case where the picture element of interest is apparently in the "background" area even if that picture element is higher in concentration than those adjacent picture elements located in selected two or more directions.

Figure 7:
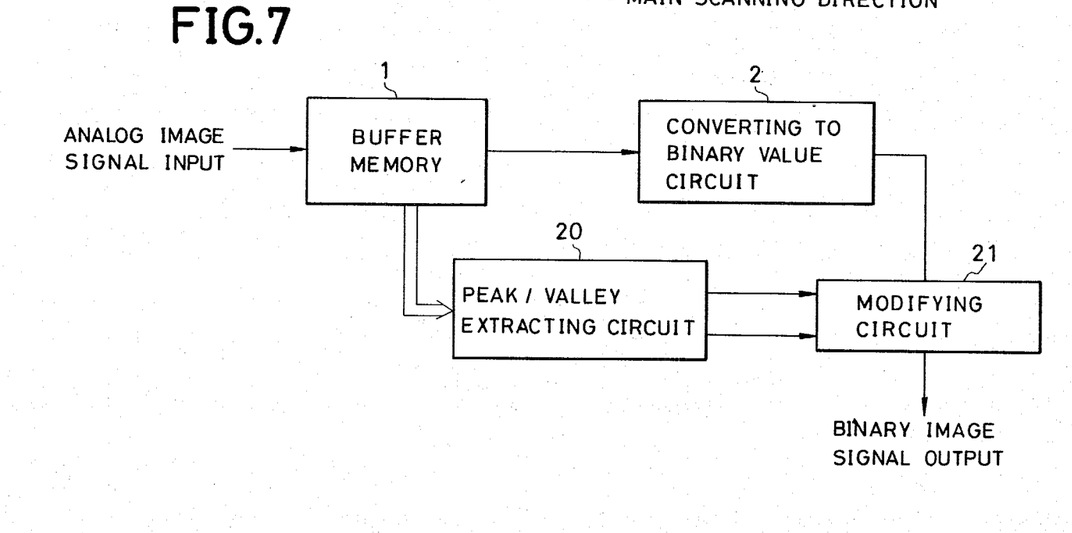
FIGS. 7 through 9 are block diagrams showing other embodiments of the present invention.

FIG. 7 shows in block diagram a further embodiment of the present analog-to-digital image signal converting system, which is characterized by including a modifying circuit 21. It is to be noted that like numerals indicate like elements as practiced throughout the specification and drawings. As shown, an analog image signal is supplied to the buffer memory 1 from an image sensor (not shown) where the signal is temporarily stored. The analog image signal is then supplied to the conversion circuit 2 picture element to picture element from the memory 1 to be processed with a predetermined threshold level thereby converting the analog image signal into a binary image signal.

On the other hand, a peak/valley extracting circuit 20 is connected to receive an analog image signal from the memory 1 to extract peak and valley points in the manner described above. Upon extraction, the extracting circuit 20 supplies a peak or valley signal to the modifying circuit 21, which modifies the binary image signal supplied from the conversion circuit 2 in response to a signal from the extracting circuit 20. That is, when a peak signal is received the modifying circuit 21 forcibly brings the level of the incoming binary image signal to the "1" (or "black") level; on the other hand, when a valley signal is received, the level of the incoming binary image signal is forcibly brought to the "0" (or "white") level. Thus, the modifying circuit 21 may be comprised of any wave-shaping circuit well known to those skilled in the art.

Figure 8:
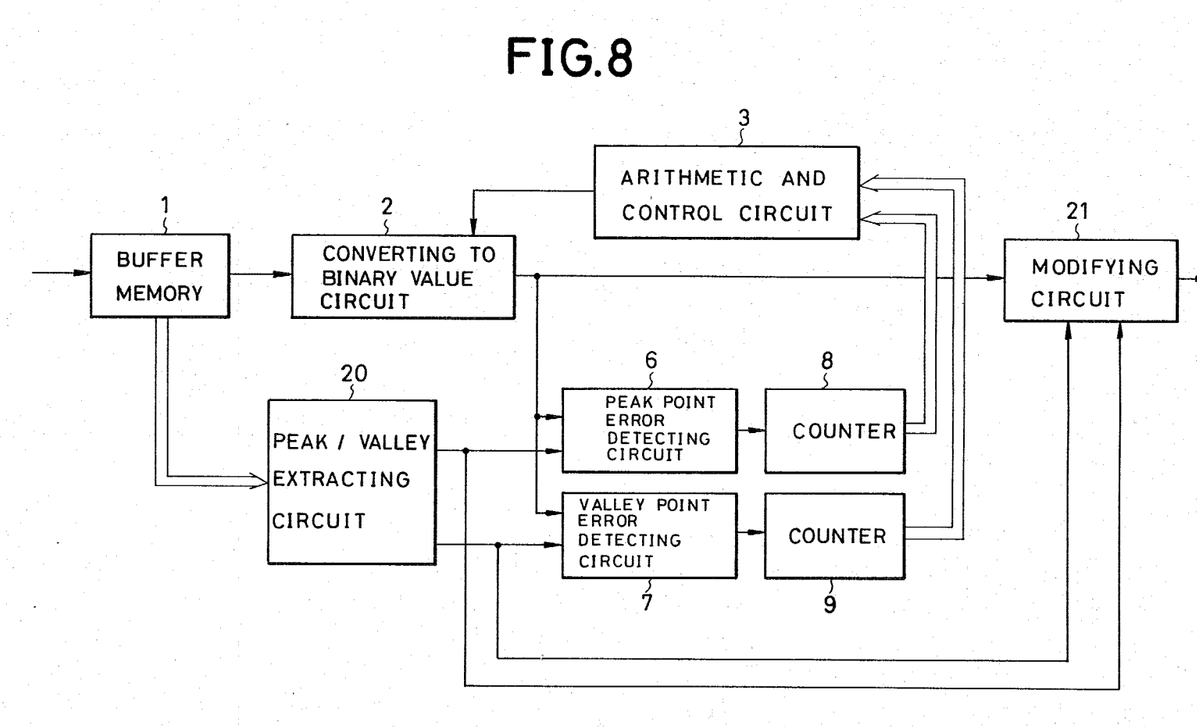

FIG. 8 shows in block diagram a still further embodiment of the present invention. As shown, the system of FIG. 8 is basically the same in structure as that of FIG. 4 except that the modifying circuit 21 is additionally provided and the integrated peak/valley extracting circuit 20 is provided.

Figure 9:
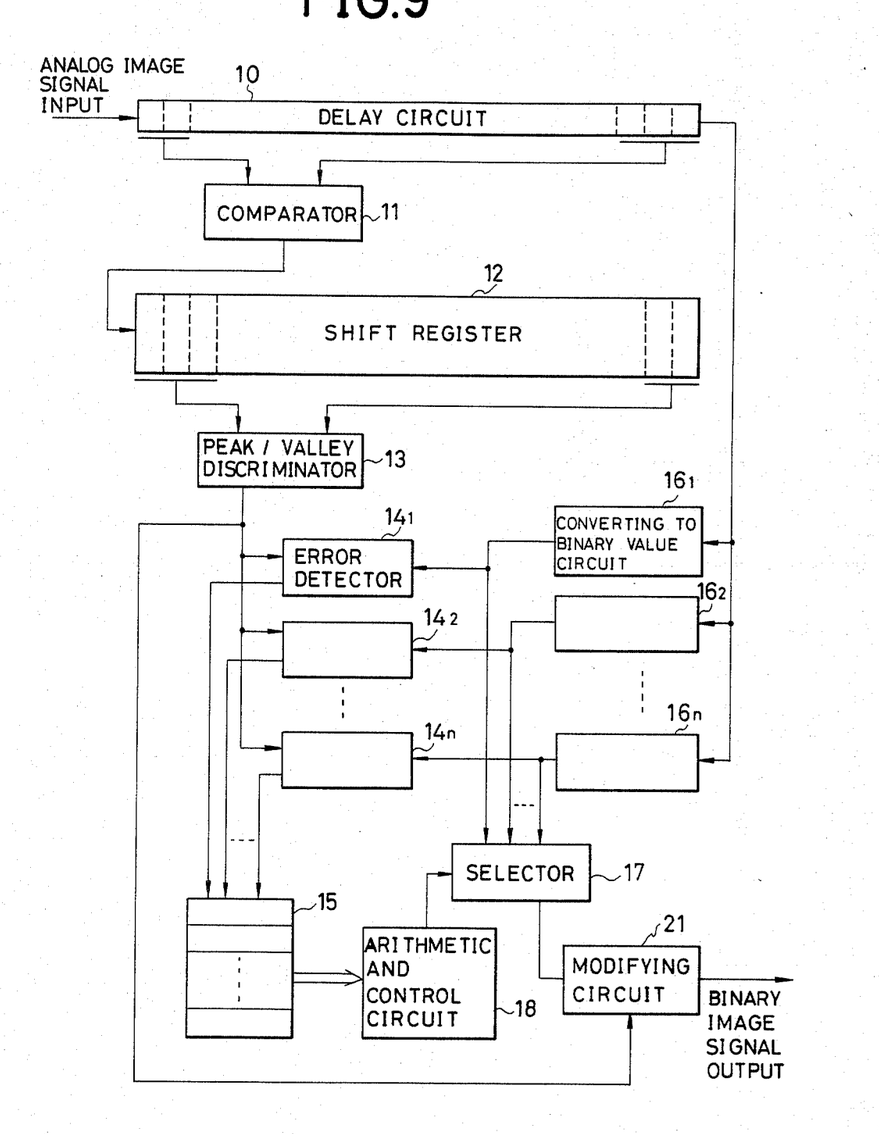

FIG. 9 shows in block diagram a still further embodiment of the present invention which is formed by adding the modifying circuit 21 to the structure shown in FIG. 5.

In these embodiments shown in FIGS. 8 and 9, the level of the binary image signal may be properly set at a desired value before being supplied as an output of the system. Other than that, they are not different structurally and in operation from the previously described corresponding embodiments.

As described in detail above, in accordance with the present invention, since an analog image signal is examined to extract peak and valley points, or picture elements, and then the threshold level to be used in analog-to-digital conversion processing is optimally determined and/or the converted digital image signal is properly modified such that the extracted points may be reflected in the digital image signal as faithfully as possible, the analog-to-digital conversion can be carried out without losing information regarding a scanned image, particularly thin lines and narrow gaps between lines existing in the image. More specifically, in accordance with the present invention, since the concentration or level of a particular picture element is compared with that of the adjacent picture elements at least in two directions in extracting peak and valley points, the present invention may be advantageously applied to an image having winding or complicated lines such as Chinese characters and complex symbols, not to mention ordinary alphanumeric characters.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A system for converting an analog image signal into a digital image signal, said analog image signal being obtained by scanning a two-dimensional image along a horizontal line progressively from top to bottom, said horizontal line including a predetermined number of picture elements in each of which the corresponding part of said analog image signal is converted into a digital value, said system comprising:

analog-to-digital converting means for converting said analog image signal into digital image signal by comparing said analog image signal with a threshold level;

extracting means for extracting peak and valley picture elements from said analog image signal, said picture element being determined as a peak picture element if its concentration is higher than those among all of its adjacent picture elements that are located in predetermined first and second directions with respect to said picture element in question, and said picture element being determined as a valley picture element if its concentration is lower than those among all of its adjacent picture elements that are located in said predetermined first and second directions with respect to said picture element in question; and control means for controlling said threshold level in accordance with the information as to peak and valley picture elements from said extracting means so that the information as to peak and valley picture elements may be well reflected in said digital image signal.

2. The system of claim 1 wherein said digital image signal is a binary image signal.

3. The system of claim 1 wherein said extracting means includes first extracting means for extracting peak picture elements and second extracting means for extracting valley picture elements, and said control means includes first error detecting means connected to receive an output from said analog-to-digital converting means and an output from said first extracting means for supplying a peak error signal as its output if these two inputs differ, second error detecting means connected to receive an output from said analog-to-digital converting means and an output from said second extracting means for supplying a valley error signal as its output if these two inputs differ and setting means for setting said threshold level in accordance with the numbers of said peak and valley error signals counted during one cycle of operation.

4. The system of claim 3 wherein said one cycle of operation is the operation to process that part of the analog image signal which corresponds to one horizontal scanning line.

5. The system of claim 3 wherein said setting means includes first and second counters which are connected to receive said peak and valley error signals, respectively, said counters cumulatively counting the numbers of said peak and valley error signals and being reset upon completion of one cycle of operation.

6. The system of claim 1 wherein said analog-to-digital converting means includes a plurality of converting elements, each of which has a different threshold level in carrying out analog-to-digital conversion, and said control means includes means for selecting one of said converting elements in accordance with the information as to peak and valley picture elements.

7. The system of claim 6 wherein said control means further includes like plurality of error detecting circuits, each of which is connected to receive an output signal from said extracting means and an output from its corresponding converting element to supply an error signal as its output if the two inputs differ, whereby the selection of said converting elements is carried out in accordance with the numbers of errors detected.

8. The system of claim 1 further comprising modifying means for modifying an output from said analog-to-digital converting means such that said output is set to a predetermined level in response to a signal from said extracting means.

9. The system of claim 8 wherein said digital signal is a binary signal and said predetermined level is the "1" state when the signal from the extracting means indicates the extraction of a peak picture element; whereas, said predetermined level is the "0" state when the signal from the extracting means indicates the extraction of a valley picture element.

10. A system for converting an analog image signal into a digital image signal, said analog image signal being obtained by scanning a two-dimentional image along a horizontal line progressively from top to bottom, said horizontal line including a predetermined number of picutre elements each having a predetermined size, said system comprising:

analog-to-digital converting means for converting said analog image signal into a digital image signal in each picture element by comparing said analog image signal with a predetermined threshold level;

extracting means for supplying peak and valley signals by extracting peak and valley points from said analog image signal such that said picture element is determined as a peak point if its concentration is higher than those among all of its adjacent picture elements that are located in predetermined first and second directions with respect to said picture element in question and said picture element is determined as a valley point if its concentration is lower than those among all of its adjacent picture elements that are located in said predetermined first and second directions with respect to said picture element in question; and modifying means for modifying the level of the digital image signal supplied from said analog-to-digital converting means in response to the peak and valley signals supplied from said extracting means to a predetermined level.

11. The system of claim 10 wherein said digital image signal is a binary image signal and said predetermined level is the "1" state when said modifying means receives a peak signal from said extracting means and the "0" state when said modifying means receives a valley signal from said extracting means.

* * * * *